United States Patent [19]

Doll

[11] Patent Number: 4,733,191
[45] Date of Patent: Mar. 22, 1988

[54] CIRCUIT FOR CHANGING A PERIODIC INTELLIGENCE SIGNAL INTO A DIRECT-CURRENT SIGNAL

[75] Inventor: Friedhelm Doll, Wermelskirchen, Fed. Rep. of Germany

[73] Assignee: Turbo-Werk Messtechnik GmbH, Cologne, Fed. Rep. of Germany

[21] Appl. No.: 928,961

[22] Filed: Nov. 10, 1986

[30] Foreign Application Priority Data

Nov. 13, 1985 [DE] Fed. Rep. of Germany ....... 3540170

[51] Int. Cl.$^4$ .............................................. G01F 1/60
[52] U.S. Cl. .................................. 329/109; 73/861.17
[58] Field of Search ..................... 329/109; 73/861.17; 307/260, 264; 328/113

[56] References Cited

U.S. PATENT DOCUMENTS 4,157,035  6/1979  Doll et al. ........................ 73/861.17

Primary Examiner—Eugene R. LaRoche
Assistant Examiner—Robert J. Pascal
Attorney, Agent, or Firm—Spensley Horn Jubas & Lubitz

[57] ABSTRACT

The circuit comprises two scanning/holding circuits (SH1, SH2), one of which (SH1) scanning the input signal during the positive half-wave, and the other (SH2) scanning the input signal during the negative halfwave. The output signals ($U_4$, $U_5$) of the scanning-/holding circuits are summed up in a summing device (A) and are fed back to the input of the second amplifier ($V_2$) which receives the intelligence signal. By this feedback of the summed anti-phase direct current signals ($U_4$, $U_5$), overlaid momentary and stationary disturbance voltages are reduced, whereas the intelligence signal is amplified by the full gain ($\mu$) of the second amplifier ($V_2$).

9 Claims, 2 Drawing Figures

CIRCUIT FOR CHANGING A PERIODIC INTELLIGENCE SIGNAL INTO A DIRECT-CURRENT SIGNAL

BACKGROUND OF THE INVENTION

1. Field of the Invention

The invention refers to a circuit for changing a periodic intelligence signal with overlaid disturbance signals into a direct-current signal the amplitude of which corresponds to that of the intelligence signal, the circuit including an input amplifier, a second amplifier behind the input amplifier, two sample and hold circuits controlled in such a manner that one of them takes over and holds the input signal of the second amplifier at each positive half-wave of the intelligence signal, and that the other takes over and holds the output signal of the second amplifier at each negative half-wave of the information signal, and a sum- and difference amplifier for receiving the signals of the sample and hold circuits via its inputs and for generating the direct-current signal.

2. Description of the Related Art

There are cases when an electric intelligence signal has the form of a rectangular pulse train of known frequency and phase position, in which cases the physical information to be evaluated determines the amplitude of this rectangular signal (intelligence signal). In magnetically inductive flow meters, for example, solenoids are activated by pulsed direct current. The fluid the flow of which is to be measured flows through the magnetic field of the solenoids. If this fluid is conductive, a potential difference is generated at the electrodes touching the fluid, the potential difference being proportional to the quantity of flow per time unit. It is known to activate the magnets of a flow determinator by pulsed direct current (U.S. Pat. No. 4 157 035). The intelligence signal received at the electrodes is applied to two sample and hold circuits that perform a sampling in different phases of the intelligence signal respectively. The output signals of the sample and hold circuits are transmitted to both inputs of a sum- and difference amplifier generating the direct current signal out of these signals.

The amplitude of the information signal often amounts to a few $\mu$Volts only. In an industrial area with many electrical disturbances it is generally difficult to evaluate small voltages of this kind. In the case of flow meters, additional disturbance signals are effected for further reasons related to hydraulic aspects and possibly leading to jumps in potential at the electrodes. Moreover, the evaluation of signals is impeded by the impulse signals having a comparatively low frequency and the signal source for generating the intelligence signal has internal resistance which varies in dependence of the fluid conductivity. Furthermore, the mentioned circuits are internally disturbed by inductive voltage peaks being induced into the electrode loop during the switching phase of the exciting current.

As to the known circuits, different measures are taken for eliminating the disturbance signals: In order to protect the evaluating circuit from a direct-current signal occuring at the electrodes, the electrodes are capacity-coupled to the evaluating circuit. Transient processes of the magnetic current result in inductive pulse pikes and eddy current effects. The influence of these disturbing signals is eliminated by waiting for the completion of the activating processes after the switching of the magnetic current and only then taking over the signal voltage into one of the sample and hold circuits. The influence of stationary disturbances from the power network can be suppressed by selecting an appropriate pulse frequency of the intelligence signal and by filter circuits. For suppressing momentary disturbances, also filters can be used. A further problem is posed by the amplifier drift which can be widely eliminated by a feedback circuit.

SUMMARY OF THE INVENTION

The known circuits necessitate various measures of compensation, filtering and protection for eliminating the influence of disturbance voltages.

It is the object of the present invention to provide a circuit of the initially mentioned kind which is capable of easily transforming an intelligence signal overlaid with disturbances into a direct-current signal.

According to the invention, the object is solved by providing a summing device for summing the output signals of the sample and hold circuits, the signal of the summing device being subtracted from the output of the input amplifier, and by the result of the subtraction being transmitted to the sample and hold circuits after being amplified by the second amplifier.

According to the invention, the signal is composed using a scanning feedback. This means that the direct-current signals, which are provided by the sample and hold circuits and the signs of which are opposed to each other, are summed, and that the summing signal is subtracted from the intelligence signal.

In the input amplifier, the potential-free intelligence signal is changed into a signal of alternately positive and negative pulses. If the positive and the negative pulses have the same peaks, the output signal of the summing device equals zero. In this case, the feedback branch is uneffective. If, however, there are displacements in potential, the signals of the sample and hold circuits do not compensate each other anymore, and the summing device generates a feedback signal which reduces the influence of the displacement in potential.

The feedback circuit according to the invention reduces the influence of a direct-current voltage component in the intelligence signal. Furthermore, momentary overlaying disturbances are eliminated.

The invention is based on the general principle of amplifying the intelligence signal while the overlaying disturbance signals are not amplified, or are weakened.

The circuit according to the invention is capable of a very stable measuring as to operating point, noise suppression and overmodulation distance.

The range of application of the circuit is not limited to signals of rectangular pattern, but also other periodically changing signal patterns can be evaluated.

Although the invention is particularly suited to the signal evaluation by an inductive flow meter with its solenoids being activated by pulsed direct current, it can be employed as well in other areas where an intelligence signal with a low amplitude is to be evaluated, e.g. in connection to elongation measurement stripes.

In the following, a preferred embodiment of the invention will be explained in greater detail in connection to an inductive flow determinator.

BRIEF DESCRIPTION OF THE DRAWINGS

The description refers to the drawings, in which.

DESCRIPTION OF THE PREFERRED EMBODIMENT

Figure 1:
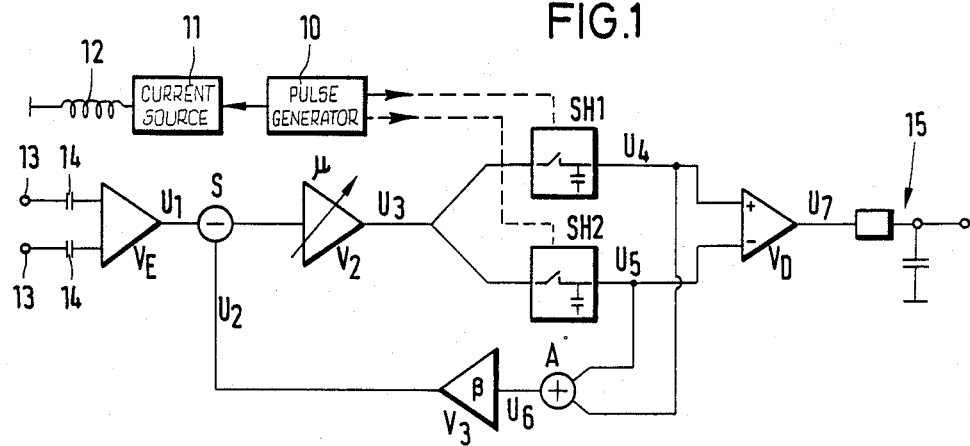
FIG. 1 shows a systematic block diagram of an embodiment of the evaluating circuit of the flow determinator.

In the described circuit, a pulse generator 10 produces pulses that are applied to a current source 11. Following the beat of the pulses, the current source 11 transmits a current to the exciting coil 12 which generates a magnetic field in the flow channel (not shown). Within the area of the fluid, electrodes 13 are arranged at the walls of the channel, between which electrodes a voltage is generated when a conductive fluid flows in the magnetic field. Each of the electrodes 13 is connected to an input of the input amplifier $V_E$ via a condensator 14. At the output of the input amplifier $V_E$ the voltage $U_1$ is generated which is applied to the plus-input of the subtractor S. The output of the subtractor is connected to the input of the second amplifier $V_2$ the output voltage of which is indicated by $U_3$. This output voltage is transmitted to the inputs of both sample and hold circuits SH1 and SH2. The output voltage of sample and hold circuit SH1 is referred to as $U_4$, and that of sample and hold circuit SH2 as $U_5$. The voltages $U_4$ and $U_5$ are applied to the inputs of a difference amplifier $V_D$. The output signal $U_7$ of the difference amplifier $V_D$ is transmitted to a mean-value generating circuit consisting of a RC network 15.

The voltages $U_4$ and $U_5$ are supplied to a summing device A the output signal of which is referred to as $U_6$. After being amplified by the third amplifier $V_3$, this output signal is transmitted as signal $U_2$ to the subtrahend input of subtractor S.

Figure 2:
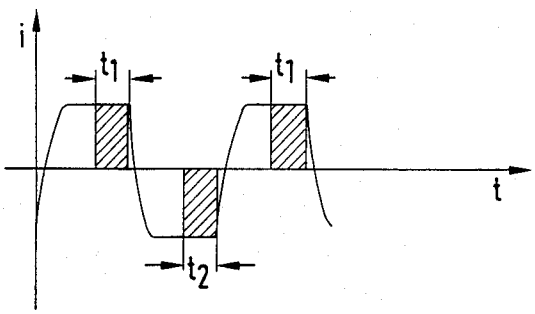
FIG. 2 shows a pulse diagram of the exciting current of the magnet coils and represents the time-related scanning areas in which the sample and hold circuits are loaded.

The sample and hold circuits SH1 and SH2 are controlled by the pulse generator 10 in such a manner that SH1 receives and holds the signal $U_3$ in the respective second half of the positive half-wave of exciting current i of exciting coil 12, whereas SH2 receives and holds the signal $U_3$ in the second half of the negative half-wave of the exciting current i. The pulses generated at the electrodes 13 and constituting the intelligence signal are in phase with the exciting current pulses illustrated in FIG. 2. In FIG. 2, $t_1$ denotes the phase in which SH1 takes over the voltage $U_3$, and $t_2$ denotes the time in which SH2 takes over the voltage $U_3$. Each of the sample and hold circuits holds the received value until, after the length of one period, a new value is received.

The gain of the second amplifier $V_2$ is referred to as $\mu$, and the gain of the third amplifier $V_3$ is denoted by $\beta$. As a matter of simplicity, in the present case there is supposed $\beta=1$. In this case, the following conditions are valid:

(1) Function in the stationary condition (a)

$U_1 = 0$ $U_2$ to $U_7 = 0$ (b)

$U_1$ = rectangular voltage with the amplitude $U_{1m}$ $U_3$ = rectangular voltage with the amplitude $U_{1m} \times \mu$ $U_4$ = direct voltage + $U_{1m} \times \mu$ $U_5$ = direct voltage − $U_{1m} \times \mu$ $U_6 = U_4 + U_5 = 0$ $U_2 = 0$ $U_7 = U_4 - U_5 = 2 \times U_{1m} \times \mu$ It can be perceived that in the stationary and non-disturbed condition no feedback is effective ($U_2=0$), so that the input voltage is amplified by the straight gain $\mu$ and is subsequently transformed into a direct current voltage corresponding to the double rectangular amplitude. In this case, the circuit is supposed to be dimensioned in such a manner that the sample and hold circuits SH1 and SH2 and the difference amplifier $V_D$ have the amplification 1 at the output.

(c)

$U_1$ = direct current voltage with the value $U_{10}$ (offset)

$U_3 = U_4 = U_5$ $U_2 = U_6$ (supposing $\beta = 1$)

$U_2 = 2 \times U_3$ $(U_{10} - 2U_3) \times \mu = U_3$ $U_{10} \times \mu - 2U_3 \times \mu = U_3$ $U_3 \times (1 + 2\mu) = U_{10} \times \mu$ $$U_3 = U_{10} \frac{\mu}{1 + 2\mu} = U_4 = U_5$$

From this, the effect as an offset regulator is evident. Without a feedback, the offset voltages would come up to $U_3 = U_4 = U_5 = U_{10} \times \mu$, whereas, using the described circuit, they make up $\cong U_3 = U_4 = U_5 = U_{10}/2$. This means that there is produced an intelligence signal amplification by the gain factor $\mu$ with the offset voltage being reduced at the same time.

(d)

Reaction upon a momentary disturbance

For the sake of simplicity, a disturbance of this kind is to be considered as a momentary offset voltage.

From (c) it can be seen that the amplitude of the disturbance is reduced by the feedback factor $1/1+\mu$ (or $1/1+2\mu$ according to the respective duration of the disturbance). Thus, the danger of the arrangement losing its measuring ability because of overstepping the limit of modulation is reduced by the same factor.

(e)

Reaction upon stationary disturbance voltages

Disturbance voltages permanently overlying the intelligence signal, e.g. voltages from the power network or high frequency disturbance voltages, are also reduced by the feedback factor $1/1+\mu$, since for such alternating voltages the feedback loop is always closed during a scanning operation. If, for example, the input voltage $U_1 = 0$ is overlaid by a sinusodial alternating voltage with the amplitude $U_{sin}$, during the closing time of SH1 there is $U_4=U_3$, while during this time $U_5$ can only be a direct current voltage, in this case: 0, because the switch of SH2 is opened.

This results in $U_2=U_4=U_3$ $$(U_{sin}-U_3)\times\mu=U_3$$

$$U_{sin}\times\mu-U_3\times\mu=U_3$$

$$U_3\times(1+\mu)=U_{sin}\times\mu$$

$$U_3 = U_{sin} \times \frac{\mu}{1+\mu}$$

Again the disturbance level for the voltages $U_3$, $U_4$, $U_5$ and $U_7$ is reduced by the feedback factor $$\frac{1}{1+\mu} = \mu'.$$

(2) Step response

In order to demonstrate the reaction of the circuit upon a sudden rectangular intelligence voltage, the individual voltages must be calculated stepwise.

The result of this calculation shows that the voltages increase according to an exponential series, the exponent corresponding to the number of the half-periods of the rectangular voltage that have passed since the start of the jump. The output voltage of the circuit $U_7$ then is given by $$U_7=2U_{1m}\times(\mu'+\mu'^2+\mu'^3+\ldots\mu'^n) \quad (1).$$

The voltage $U_7$ existing after a certain number n corresponds to the partial sum of the exponential series $$U_7 = 2U_{1m} \times \left( \frac{1-\mu'^n}{1-\mu'} - 1 \right). \quad (2)$$

The series converges against $$U_7 = 2U_{1m} \times \left( \frac{1}{1-\mu'} - 1 \right) = 2U_{1m} \times \mu. \quad (3)$$

Equation (3) indicates that $U_7$ converges against the stationary value according to (1) (b).

Equation (2) gives an approximate time constant corresponding to the product resulting from gain $\mu$ and to the period length of the rectangular signal.

In contrast to prior art feedback circuits, the described circuit has an amplification by the factor $\mu$ and not of $$\mu' = \frac{\mu}{1+\mu},$$

while disturbing factors like noise, drifting, offset, and dynamic disturbing pulses are amplified by the amplification $\mu'\simeq 1/1+\mu\beta$, but accordingly are not amplified when $\beta=1$.

What is claimed is:

1. Circuit for changing a periodic intelligence signal with overlaid disturbance signals into a direct-current signal the amplitude of which corresponds to that of an intelligence signal, comprising:

an input amplifier,
a second amplifier located subsequent to the input amplifier,
two scanning/holding circuits controlled in such a manner that one of them receives and holds the output signal of the second amplifier at each positive half-wave of the information signal, and that the other receives and holds the output signal of the second amplifier at each negative half-wave of the information signal, and
a sum and difference amplifier for receiving the signals of the scanning/holding circuits via its inputs and for generating the direct-current signal,
characterized in that a summing device is provided for summing up the output signals of the scanning-/holding circuits, the output signal of the summing device being subtracted from the output signal of the input amplifier, and in that the result of the subtraction is transmitted to the scanning/holding circuits after being amplified by the second amplifier.

2. A circuit according to claim 1, characterized in that the output signal of the summing device is amplified by a third amplifier.

3. A circuit according to claim 1, characterized in that the gain of the second amplifier is variable.

4. A circuit according to claim 1, characterized in that the gain of the second amplifier is greater than or equal to 1.

5. A circuit according to claim 2, characterized in that the gain of the third amplifier is 1.

6. A circuit for transforming an information carrying intelligence signal overlaid with disturbances into a direct-current signal, comprising:

generating means for generating a signal of alternating positive and negative pulses having amplitudes determined by said information carried by said intelligence signal;
first and second sample and hold circuits for receiving and holding said positive and negative pulses respectively, wherein each of said first and second sample and hold circuits provide an output signal corresponding in amplitude to the amplitude of said positive and negative pulses respectively;
a difference amplifier for receiving said output signals of said sample and hold circuits and for providing an output signal corresponding in amplitude to the difference of the amplitude of said output signals of said first and second sample and hold circuits; and
feedback means comprising a summing device adapted to provide a signal corresponding in amplitude to the sum of the amplitudes of the output signals of said first and second sample and hold circuits and a subtracting device adapted to subtract the amplitude of the signal provided by said summing device from the amplitude of said signal of alternating positive and negative pulses.

7. A circuit for transforming an intelligence signal having alternating positive and negative pulses overlaid with disturbances into a direct-current signal, comprising:

first and second sample and hold circuits for receiving and holding said positive and negative pulses respectively, wherein each of said first and second sample and hold circuits provide an output signal corresponding with said positive and negative pulses respectively;

a difference amplifier for receiving said output signals of said sample and hold circuits and for providing an output signal corresponding with the difference of said output signals of said first and second sample and hold circuits; and feedback means comprising a summing device adapted to provide a signal corresponding with the sum of the output signals of said first and second sample and hold circuits and a subtracting device adapted to subtract the signal provided by said summing device from said signal of alternating positive and negative pulses;

wherein the output of said difference amplifier is a direct-current signal corresponding to said intelligence signal.

8. A method for transforming an information carrying intelligence signal overlaid with disturbances into a direct-current signal, comprising the steps of:

changing said intelligence signal into a signal of alternately positive and negative pulses having amplitudes determined by the information carried by said intelligence signal;

supplying said positive pulses to a first sample and hold circuit and said negative pulses to a second sample and hold circuit;

providing a first output signal, having amplitudes corresponding to those of said positive pulses, from said first sample and hold circuit and a second output signal, having amplitudes corresponding to those of said negative pulses, from said second sample and hold circuit;

summing said first and second output signals to produce a third output signal;

subtracting said third output signal from said signal of alternately positive and negative pulses to thereby produce a feedback altered signal of alternately positive and negative pulses for supplying to said sample and hold circuits;

subtracting said second output signal from said first output signal to produce a fourth output signal; and generating a mean value of said fourth output signal.

9. A method for transforming an intelligence signal having alternating positive and negative pulses overlaid with disturbances into a direct-current signal, comprising the steps of:

supplying said positive pulses to a first sample and hold circuit and said negative pulses to a second sample and hold circuit;

providing a first output signal, corresponding with said positive pulses, from said first sample and hold circuit and a second output signal, corresponding with said negative pulses, from said second sample and hold circuit;

summing said first and second output signals to produce a third output signal;

subtracting said third output signal from said signal of alternately positive and negative pulses to thereby produce a feedback altered signal of alternately positive and negative pulses for supplying to said sample and hold circuits;

subtracting said second output signal from said first output signal to produce a fourth output signal; and generating a mean value of said fourth output signal.

* * * * *